United States Patent
Natalis et al.

(10) Patent No.: US 10,664,736 B2
(45) Date of Patent: May 26, 2020

(54) METHOD AND APPARATUS FOR APPLYING ANTENNAS FOR RFID DEVICES ON A LAMINAR SUPPORT

(71) Applicant: AUTOMATION 4 INDUSTRIAL SOLUTIONS S.R.L., Muggio' (IT)

(72) Inventors: Giovanni Natalis, Pietra Ligure (IT); Paolo Stefanelli, Milan (IT)

(73) Assignee: AUTOMATION 4 INDUSTRIAL SOLUTIONS S.R.L., Muggio (IT)

( * ) Notice: Subject to any disclaimer, the term of this patent is extended or adjusted under 35 U.S.C. 154(b) by 43 days.

(21) Appl. No.: 16/087,771

(22) PCT Filed: Mar. 21, 2017

(86) PCT No.: PCT/IB2017/051619
§ 371 (c)(1),
(2) Date: Sep. 24, 2018

(87) PCT Pub. No.: WO2017/163175
PCT Pub. Date: Sep. 28, 2017

(65) Prior Publication Data
US 2019/0114523 A1 Apr. 18, 2019

(30) Foreign Application Priority Data
Mar. 23, 2016 (IT) .................. 10201630517

(51) Int. Cl.
*G06K 19/077* (2006.01)
*H05K 1/16* (2006.01)
*H05K 3/10* (2006.01)

(52) U.S. Cl.
CPC ....... *G06K 19/07718* (2013.01); *H05K 1/165* (2013.01); *H05K 3/103* (2013.01);
(Continued)

(58) Field of Classification Search
CPC ........ G06K 19/00; G06K 19/06; G06K 19/04; G06K 19/067
(Continued)

(56) References Cited

U.S. PATENT DOCUMENTS 3,674,914 A 7/1972 Burr
5,514,862 A * 5/1996 Salzano ............... A45C 11/182
235/486

(Continued)

FOREIGN PATENT DOCUMENTS

EP 0210520 A2 2/1987
WO WO2006079913 A1 8/2006

OTHER PUBLICATIONS

International Search Report and Written Opinion dated Jul. 18, 2017 for counterpart PCT Application No. PCT/IB2017/051619.

*Primary Examiner* — Edwyn Labaze
(74) *Attorney, Agent, or Firm* — Shuttleworth & Ingersoll, PLC; Timothy J. Klima (57) ABSTRACT

An apparatus for the application of antennas comprises an applicator slidably guided relative to a support bracket parallel to a vertical movement axis, and operating in an elastic thrust relationship against a laying plane bearing a laminar support. Guiding members lead an terminal portion of an elongated element made of conductive material in an application position between the applicator and the laying plane. Movement devices translate the applicator according to respectively orthogonal movement axes, including said vertical movement axis, for depositing the elongated element according to a desired path on the laminar support. Translations along the vertical movement axis determine the selective activation/deactivation of a braking element and a cutting member carried by a rocker arm associated to the applicator and operating on the terminal portion.

13 Claims, 5 Drawing Sheets

(52) U.S. Cl.
    CPC .............. *H05K 2201/10098* (2013.01); *H05K 2201/10287* (2013.01)

(58) Field of Classification Search
    USPC ................................. 235/492, 487, 380, 375
    See application file for complete search history.

(56) References Cited

U.S. PATENT DOCUMENTS

| | | | | |
|---|---|---|---|---|
| 5,968,307 | A | * | 10/1999 | Siler ...................... B65H 39/14 156/302 |
| 2002/0100810 | A1 | | 8/2002 | Amadeo |
| 2011/0215144 | A1 | * | 9/2011 | Casto ...................... B32B 37/02 235/380 |

* cited by examiner

METHOD AND APPARATUS FOR APPLYING ANTENNAS FOR RFID DEVICES ON A LAMINAR SUPPORT

This application is the National Phase of International Application PCT/IB2017/051619 filed Mar. 21, 2017 which designated the U.S.

This application claims priority to Italian Patent Application No. 102016000030517 filed Mar. 23, 2016, which application is incorporated by reference herein.

The object of the present invention is a method and an apparatus for applying antennas for RFID devices on a laminar support.

More particularly, the invention is aimed at the realization of RFID devices consisting of an RFID module in the form of an integrated circuit provided with at least one antenna in the form of a copper wire or other conductive material, enclosed between a flat support, for example in the form of a paper sheet or other material, and a laminar coverage layer.

The manufacture of RFID devices by means of productive plants comprising various work stations in which a laminar support, for example made of paper material, is sequentially subjected to the respective operations required for the simultaneous completion of a plurality of RFID devices, is known.

At the end of processing, the RFID devices formed on the laminar support lend themselves to be individually separated from each other to be destined to their final use.

In the production lines of the type indicated above, the use a module application station which provides for the application of a plurality of RFID modules on a laminar support in the form of an adhesive sheet, suitably moved through the station itself, is known.

The adhesive sheet bearing the RFID modules then reaches an antenna application station by which each of the RFID modules is associated to an antenna, for example in the form of metal wire.

Downstream of the antenna application station other operating stations can be provided for the execution of further operations such as for example the fixing of the ends of the antenna on the RFID module terminals, the coupling of a protective layer to the laminar support, and more.

The document WO-2006/079913 describes an apparatus usable in an application station for antennas, equipped with a dispensing spout by means of which a continuous elongated element made of conductive material is dispensed on the laminar support, supported by a laying plane. The dispenser is supported by an operating head which can be moved vertically and along two axes of a Cartesian system, to distribute the continuous elongated element according to a predetermined path. A different embodiment describes the use of a presser roller coupled to a cutting member and rotatable together with the latter around a vertical axis, in order to deposit the elongated element according portions angularly arranged between them, in cooperation with a movement of the laminar support according to two Cartesian axes.

The Applicant believes that the current systems for the realization of RFID devices may be significantly improved in many aspects, for example in terms of structural simplicity, productivity, operational flexibility and qualitative precision of the final product.

In this respect, the Applicant believes that, for the purposes of a correct execution of the processing, it is appropriate that the continuous elongated element used for the realization of the antennas is deposited on the laminar support by means of a thrust action adequately controlled and preferably constant. To increase the reliability and simplify the structure and the tuning operations of the machinery, it is also preferable, according to the Applicant, that this thrust action can be achieved with reliable repeatability, even regardless of any external factors, such as, for instance, inaccuracies of the position of the operating head supporting the applicator member, thickness variations of the laminar element used, imperfections of parallelism or flatness of the laying plane etc.

It is an object of the present invention to propose a new method and an apparatus usable in a work station forming part of a plant for the production of RFID devices, in order to allow the application of antennas on a laminar support in a reliable and precise way.

In particular, the Applicant wants to propose an apparatus in which the antennas of the RFID devices can be realized quickly and accurately on a laminar support in the form of a continuous sheet or tape, moved longitudinally through work stations arranged according to a linear path along a processing line, for example for the effect of a pulling exerted downstream of the processing line.

More particularly, the object of the present invention is a method for applying antennas of RFID devices on a laminar support according to the present disclosure.

In accordance with a further aspect, the invention proposes an apparatus for applying antennas of RFID devices on a laminar support according to the present disclosure.

In accordance with the present invention, the Applicant believes that the elastically sliding engagement of the applicator with respect to the operating head can achieve an optimal antenna application thanks to a better control of contact pressure between the applicator and the laminar layer during deposition, not influenced by those factors that are difficult to control, such as for instance vertical oscillations of the head and/or flatness imperfections of the laminar support. The mobility of the operating head with respect to the applicator during the deposition process can also be used, if necessary, to determine the activation of accessory devices.

In at least one of the above aspects, the invention can also advantageously comprise one or more of the following preferred features.

Preferably, the support bracket is to be brought closer to the laying plane after the terminal portion of the elongated element reached the laminar support, in order to determine a vertical movement of the applicator with respect to the support bracket starting from a rest condition, in which the applicator acts in a thrust relationship against an abutment seat carried by the support bracket to a working condition in which the applicator is separate from the abutment seat and operates in a thrust relationship towards the laying plane of the laminar support.

Preferably, auxiliary treatment devices operating on the elongated element in the vicinity of the applicator are selectively activated/deactivated as a result of a vertical movement of the cursor with respect to the support bracket.

Preferably, the vertical movement of the applicator relative to the support bracket triggers a rocker arm oscillatably bound to the applicator and carrying said auxiliary treatment devices.

Preferably, before coming into contact against the laminar support, the terminal portion of said elongated element is blocked against the applicator by means of a braking element operating in thrust relationship towards the applicator Preferably, the action of the braking element is interrupted after the terminal portion of the elongated element has come into contact against the laminar support, before implementing said relative movement.

Preferably, the interruption of the action of the braking element is controlled by bringing the support bracket to an unlocked position by further approaching the same support bracket to the laminar support, after which the terminal portion of the elongated element has come against the laminar support.

Preferably, at the end of the deposition, said elongated element is severed by means of a cutting member operable by means of vertical movement of the applicator with respect to the support bracket Preferably, when the cutting member is activated, the support bracket is brought to a cutting position spaced from the laminar support according to a lower measurement if compared to the release position.

Preferably, during deposition, the applicator is oriented around an axis of oscillation perpendicular to the laminar support, according to controlled rotations in conjunction with the movement along said longitudinal movement axis and transverse movement axis.

Preferably, during the deposition, the axis of rotation of a presser roller forming part of the applicator maintains a perpendicular orientation relative to the deposition path.

Preferably, the process according to the invention is feasible in the context of a method for the production of RFID devices, comprising the actions of: translating longitudinally a continuous laminar support according to mutually subsequent movement steps intercalated by shut-down phases, along a processing line; applying, at every movement step, at least one RFID module in correspondence of at least a module application station; applying, at every movement step, at least one antenna in correspondence to at least an antenna application station.

Preferably, in at least said antennas application station, the position of a reference index provided on the laminar support is detected, in conjunction with each of said shut-down phases. Preferably, said at least one antenna is applied in a predetermined position with respect to said reference index.

Preferably, said applicator is movable, with respect to the support bracket, between a rest condition, in which it thrusts against an abutment point supported by the support bracket and at least one working condition in which it is spaced from the abutment seat and operates in a thrust relationship towards the laying plane of the laminar support.

Preferably, auxiliary treatment devices are provided, operating on said elongated element in the vicinity of the applicator, that can be selectively activated as a result of movements of the applicator relative to the support bracket.

Preferably, said auxiliary treatment devices are supported by a rocker arm element oscillatably bound to the applicator.

Preferably, the rocker arm element is movable as a result of the movement of the applicator relative to the support bracket.

Preferably, auxiliary return devices are envisaged that operate on the rocker arm element to resiliently retain the latter in a first operating condition.

Preferably, the rocker arm element is movable from the first operative condition in contrast with said auxiliary return devices, following a movement of the applicator from the respective rest condition.

Preferably, said auxiliary treatment devices comprise a braking element that thrusts against the applicator to lock against the same applicator the terminal portion of said elongated element.

Preferably, the braking element locks the terminal portion when the applicator is in the rest condition.

Preferably, said auxiliary treatment devices comprise a cutting member movable towards the laying plane for severing the elongated element in correspondence of the applicator.

Preferably, said applicator comprises a presser roller, rotatable around a corresponding rotation axis parallel to the laying plane.

Preferably, said presser roller is rotatably carried by a cursor slidably engaged with respect to said support bracket.

Preferably, said cursor is slidably engaged in a bushing rotatably supported by said support bracket.

Preferably, said applicator comprises a bushing rotatably supported by said support bracket and a rotary actuator operating between the support bracket and said bushing to orient the applicator about a vertical pivot axis.

Preferably, the braking element has a through channel extending according to a direction substantially tangential with respect to the outer cylindrical surface of the presser roller, preferably in a median plane with respect to the roller itself.

Preferably, at least said applicator is supported by a support bracket supporting one or more runners to slidably engage the apparatus to sliding guides.

Preferably, said support surface supports at least an abutment element to be operatively engaged in at least one engagement seat carried by an interchangeable positioning template.

Preferably, the apparatus according to the present invention can be used in a plant for the production of RFID devices, comprising a plurality of work stations disposed consecutively along a processing line; a driving unit for driving a longitudinally continuous laminar support, according to subsequent movement steps mutually intercalated by stopping phases, along said processing line; at least one of module application station comprising at least one apparatus according to the present invention, configured to apply, at every movement step, at least one RFID module, and at least one antenna application station configured to apply, at every movement step, at least one antenna coupled to said RFID module.

Preferably, at least one of said module application station and antenna application station comprises sensing devices to detect the position of at least one reference index carried by the laminar support, and at least one movement device to adjust the position of at least one of said applicators with respect to said reference index.

Preferably, said translation devices include a driving unit operating downstream of the work stations.

Preferably, at least said application station for antennas comprises a plurality of application apparatuses for antennas.

Preferably, said application apparatuses for antennas can be placed transversely to the longitudinal development of the laminar support, preferably along a supporting arm being part of said movement device.

Preferably, said at least one application station for antennas comprises an interchangeable positioning template rigidly engageable to said support arm and bearing insertion points cooperating with respective abutment members carried by said support bracket, in order to fix the positioning of the application apparatus for antennas along the support arm.

Further features and advantages will become more apparent from the detailed description of a preferred, but not exclusive, embodiment of a method for the application of antennas for RFID devices on a laminar support, and of an apparatus operating according to said method, in accordance with the present invention.

Such description will be set forth hereinafter with reference to the accompanying drawings given only for illustrative purposes and not by way of limitation, in which.

FIGS. 1a, 1b and 1c, 2a, 2b and 2c generally illustrate a plant for the realization of RFID devices, integrating at least an apparatus for the application of RFID modules in accordance with the present invention.

The plant includes a processing line 1 defined by a plurality of work stations 2 consecutively aligned in mutual juxtaposition, preferably along a substantially rectilinear direction.

Figure 1A:
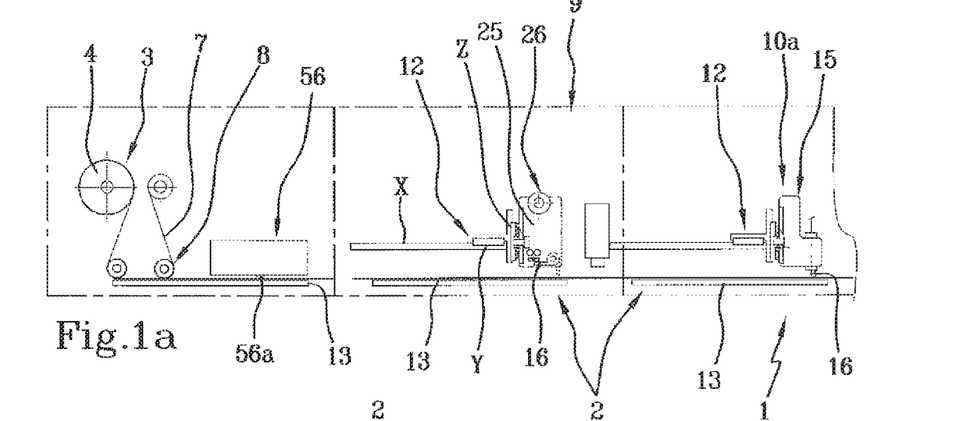
FIGS. 1a, 1b and 1c show schematically in a side view, respectively, consecutive portions of a plant realized in accordance with the present invention.
Figure 1B:
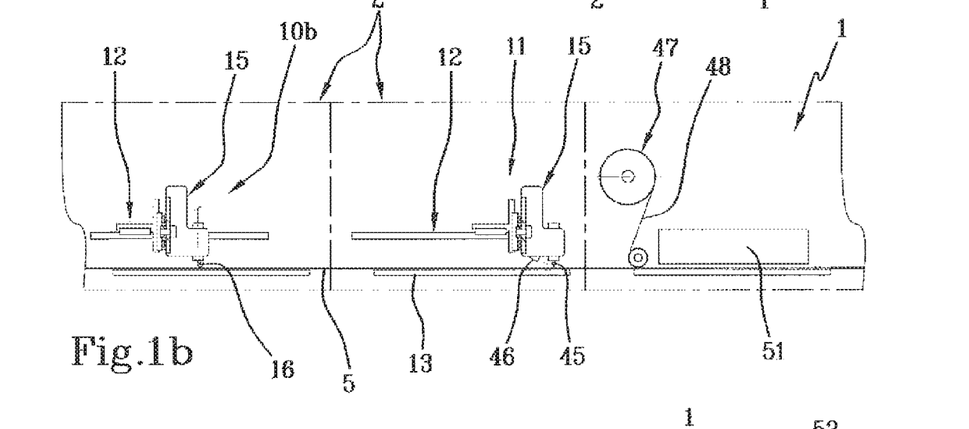
Figure 1C:
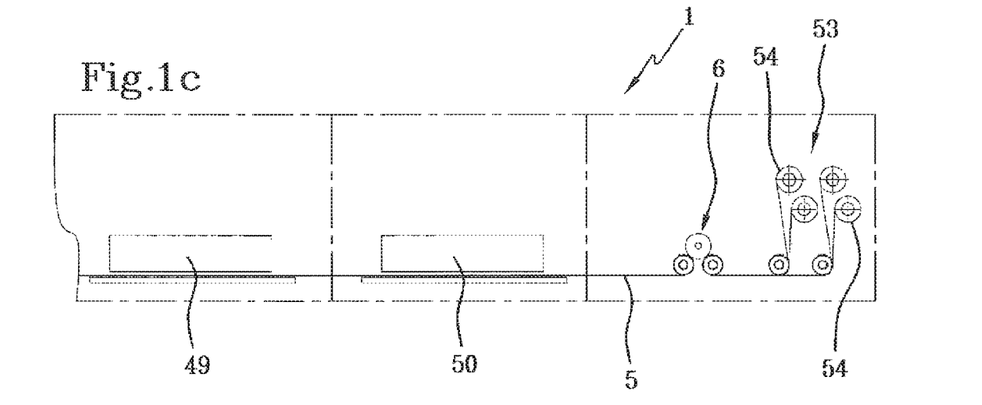
Figure 2A:
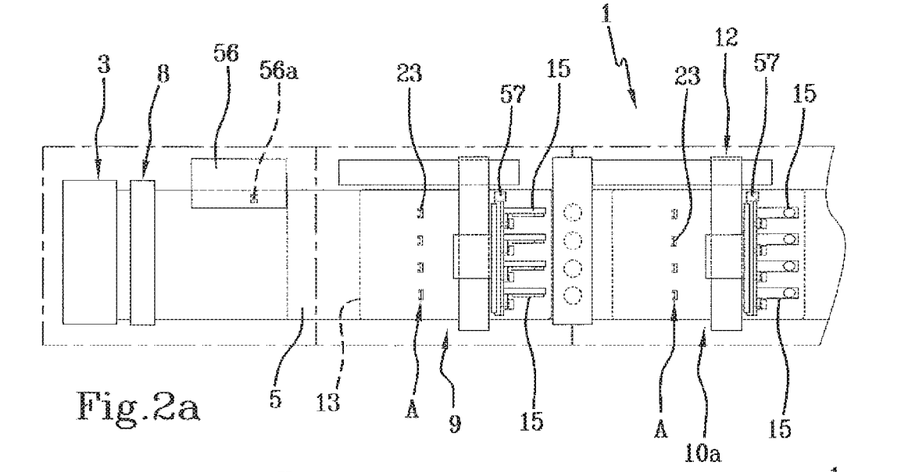
FIGS. 2a, 2b and 2c are plan views of the portions of the plant of FIG. 1.
Figure 2B:
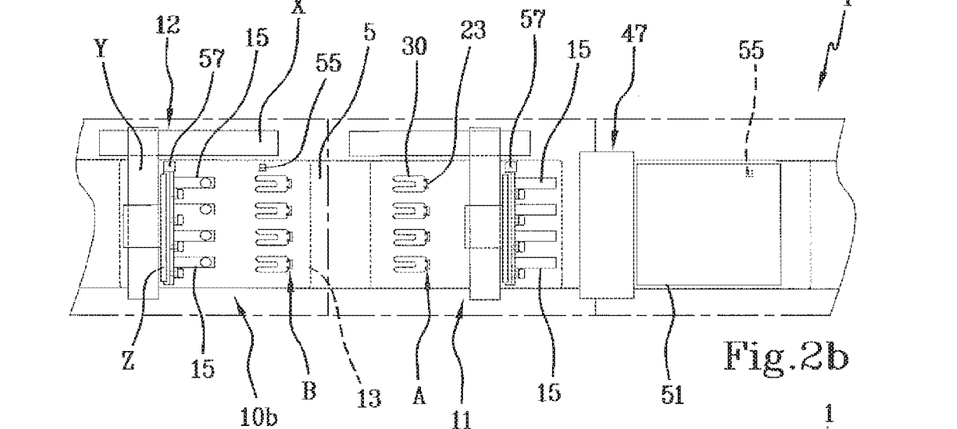
Figure 2C:
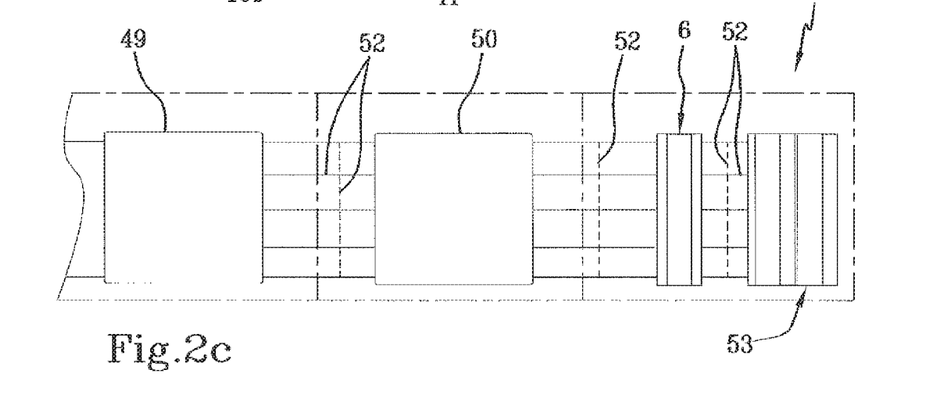

Upstream of the processing line 1 is a feed assembly 3 carrying, for instance, a coil or other storage element 4 from which a continuous laminar support 5 is progressively withdrawn and made to advance along the processing line 1 by a drag assembly 6 placed downstream.

The laminar support 5 may for example be realized in form of a sheet of paper, plastic or other material, preferably provided with an adhesive layer applied on its upper surface. A protective film 7 on the previously applied adhesive layer is removed upon the action of a rewinding assembly 8 located in the proximity of the feed assembly 3, in conjunction with the advancement of the laminar support 5.

The advancement of the laminar support 5 by the drag assembly 6 preferably occurs according to a step-by-step movement. In other words, the continuous laminar support 5 is moved longitudinally along the processing line 1 in subsequent movement steps, mutually intercalated by stop phases. The amplitude of each movement step is substantially equal to the distance between two consecutive work stations 2, or to a submultiple of said distance.

The work stations 2 may for example include at least one module application station 9 and at least one antenna application station 10a, 10b and, preferably, at least one fixing station 11. In the example shown, a first and a second antenna application station 10a, 10b, respectively contiguous, are provided.

Preferably, with reference to the direction of advancement of the laminar support 5, the module application station 9 is arranged upstream of the antenna application station(s) 10a, 10b.

In the accompanying drawings, 12 generally indicates movement devices 12 present in one or more of the work stations 2, to apply on the laminar support 5, at each working cycle, at least a constructive component of an RFID device.

In the illustrated example, the movement devices 12 are installed on the module application station 9, on each of the antenna application stations 10a, 10b and on the fixing station 11.

Each movement device 12 is positioned above a support surface 13 on which the laminar support 5 shifts, and rigidly engages one end of a support arm 14 overhanging above the support surface 13. The support arm 14, spaced in parallel from the support surface 13, carries at least one operating head 15 specifically configured for the application of the respective constructive component by means of a respective applicator 16. In a preferential embodiment, the support arm 14 is associated to a plurality of operating heads 15, for example four, each carrying a respective applicator 16.

It may be advantageously provided that the operating heads 15 belonging to a same work station 2 are removably positionable along the respective support arm 14, in a direction transverse to the longitudinal extension of the laminar support 5. To this end, the support arm 14 is preferably provided with one or more sliding guides 18, operatively engaged by respective runners 19 carried by each of the operating heads 15.

An interchangeable positioning template 20 can also be fixed to the support arm 14 carrying a plurality of engagement seats 21, each of which cooperates with a respective abutment element 22 carried by one of the heads, to fix their positioning along the support arms 14. Setting operations of the work station 2 are thus simplified, since the number and positioning of the operating heads 15 can be easily changed depending on the needs, by possibly replacing the positioning template 20.

Each handling device 12 provides the movement of each operating head 15 and of the respective applicator 16 preferably according to at least three axes Y, X, Z, respectively orthogonal. For the purposes of the present description, it is possible identify a longitudinal movement axis Y, parallel to the longitudinal extension of the continuous laminar support 5, a transverse movement axis X, perpendicular to the longitudinal extension of the laminar support 5, and a vertical movement axis Z, with respect to the laying plane 13 of the laminar support 5. The longitudinal movement axis Y and transverse movement axis X are perpendicular to each other and parallel to the laying plane, respectively coplanar or arranged on parallel planes.

The movement devices 12 of the different work stations 2 may be substantially identical to each other. On the contrary, the operating heads 15 and the respective applicators 16 are each specifically configured according to the operation to be performed in the respective work station 2.

In this respect, each operating head which equips the movement device 12 installed in the module application station 9 is configured to apply on the laminar support 5, at each movement step, a respective RFID module 23, preferably made in the form of a microchip.

Figure 3:
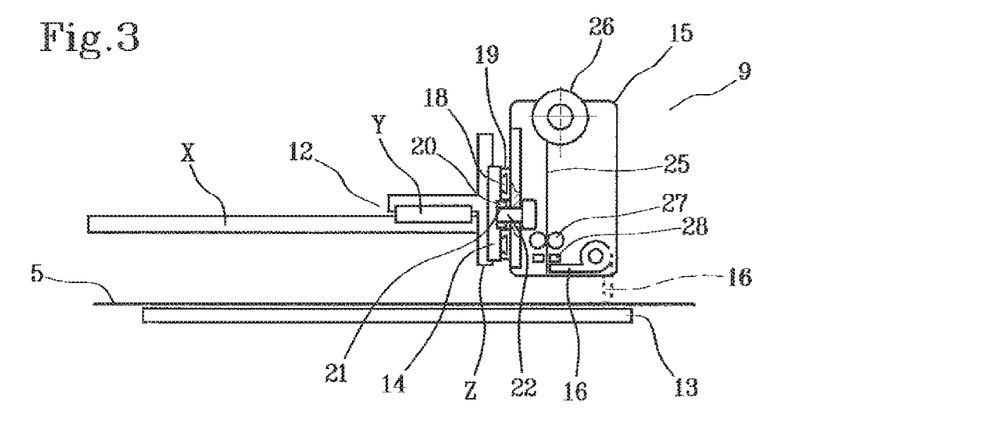
FIG. 3 is a schematic representation illustrating a module application station in side view.

To this end, each operating head 15 associated with the module application station 9, not described in detail since it is achievable in different ways, may for example comprise a supply reel 26 of the RFID modules 23, preferably distributed along a continuous tape 25 coming from the reel itself. Pulling means 27 operating on the continuous tape 25 shall individually transfer the RFID module 23 to a cutting unit 28. The cutting unit 28 is selectively operable to separate from the continuous tape 25 each RFID module 23 together with a length of the tape itself, making it available for the relevant applicator 16 of RFID modules 23. The applicator 16 of the RFID modules 23 may for example comprise a gripping member, preferably movable by means of an angular rotation, between a gripping position, in which it retains the RFID module 23 near the cutting unit 28, and a release position, in which it is oriented towards the support surface 13, in order to release the RFID module 23 on the underlying laminar support 5, preferably as a result of descent along the vertical movement axis Z.

Each of the operating heads 15 which equip the movement device 12 installed on each antenna application station 10a, 10b comprises an antenna application apparatus 29 configured to be applied at least one antenna 30 on the laminar support 5, at each movement step. Each of the antennas 30 applied on the laminar support 5 is coupled to one of the RFID modules 23, with its opposite ends 30a placed in contact with respective terminals 24 supported by the RFID module 23.

Each antenna 30 is preferably formed by means of a continuous elongated element 31, e.g. a metal wire or any other conductive material, preferably copper treated with an external insulation coating.

Each antenna application apparatus 29 lays the continuous elongated element 31 according to a predetermined deposition path which can be chosen each time based on the type of RFID device 17 to be realized.

Figure 4:
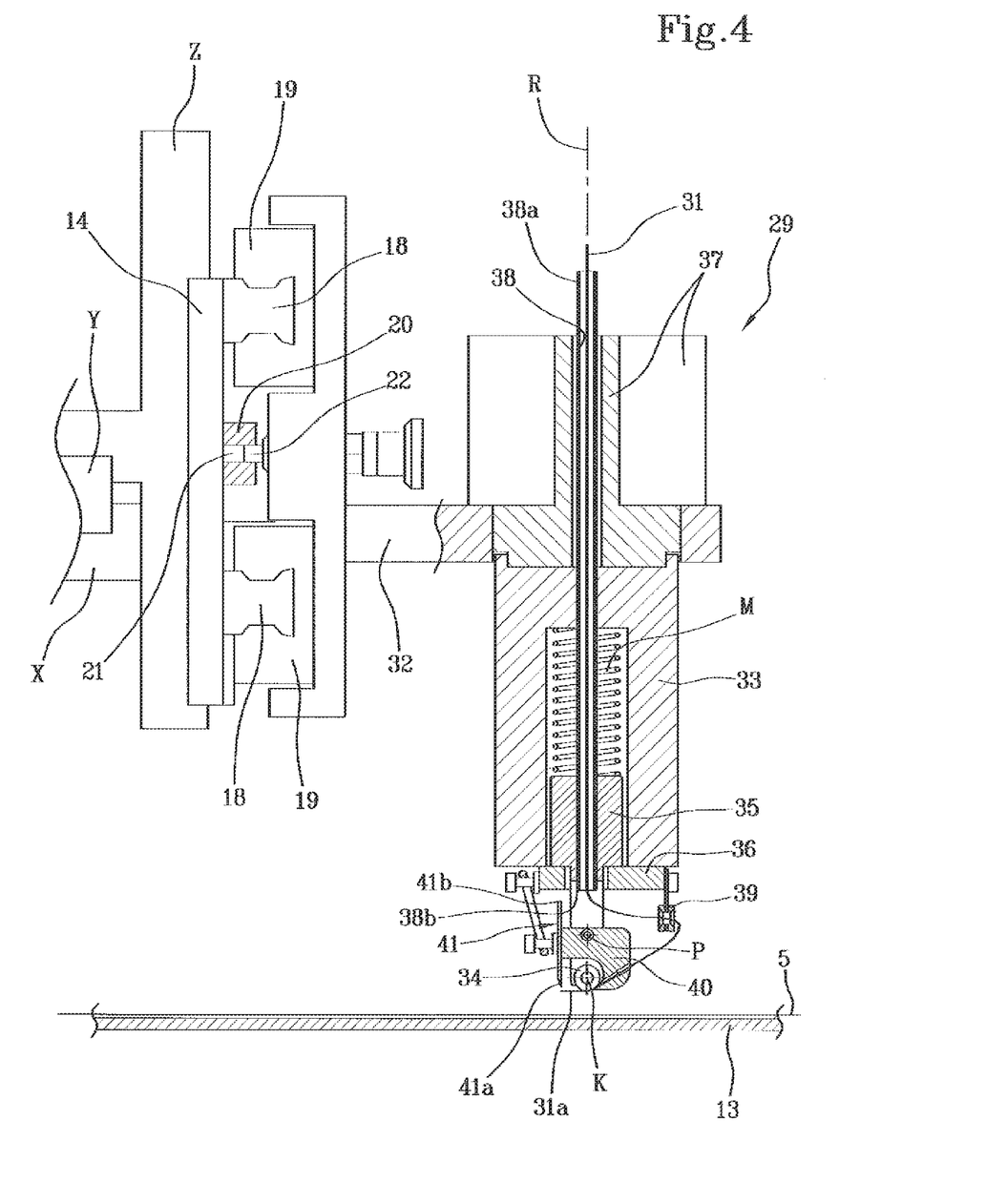
FIG. 4 shows in an interrupted side view an embodiment of an application apparatus for antennas according to the invention in a standby condition.

To this end, each antennas application apparatus 29 preferably comprises a support bracket 32 to which one or more of the above mentioned runners 19 can be fixed for sliding engaging apparatus 23 to the guide rails 18, as well as at least one of said abutment elements 22 to be operatively engaged in corresponding insertion points 21.

A bushing 33, rotatable about a vertical oscillation axis R, perpendicular to the laminar support 5 lying on the laying plane 13, is operatively engaged to the support bracket 32. More specifically, the bushing 33 is preferably secured to a rotor 37a of a rotary actuator 37, such as a stepper motor, fixed to the support bracket 32.

The bushing 33 operatively engages a respective applicator 16 of antennas.

In a preferred embodiment, the applicator 16 comprises a presser roller 34 that rotates idly about a respective rotation axis K parallel to the laying plane 13. Preferably, the presser roller 34 is rotatably supported by a cursor 35, which is in turn slidably engaged in the bushing 33 and rotationally locked with respect to it.

The applicator 16 projects downwards from the support bracket 32 towards the support surface 13, and is therefore slidably guided with respect to the support bracket 32 along a direction that runs parallel to the vertical movement axis Z.

Elastic contrast devices M, comprising for example a helicoidal spring acting between the bushing 33 and the cursor 35, constantly push the applicator 16 towards the laying plane 13. The applicator 16 is movable toward the support bracket 32 in opposition to elastic contrast devices M, between a rest condition and at least one working condition. In the rest condition, an abutment shoulder 35a supported by the cursor 35 thrusts against an abutment point 36a supported by the support bracket 32. More particularly, the abutment seat 36a is for example formed on an end plate 36 fixed to the bushing 33. In the working condition, the abutment shoulder 35a is spaced from the abutment seat 36a.

The rotary actuator 37 operates between the support bracket 32 and the bushing 33 to properly orient the applicator 16 about the vertical oscillation axis R.

Guiding members 38, 39 operate on the elongated element 30 coming from a respective supply reel (not shown) to lead it along a predetermined supply path belonging to the respective applicator 16, so that a terminal portion 31a of the elongated element 31 is placed in an application position located between the applicator 16 and the laminar support 5 lying on the laying plane 13.

In a preferred embodiment, the guiding members 38, 39 comprise a longitudinal channel 38 extending through the cursor 35 along the oscillation axis R of the applicator 16. Preferably, the longitudinal channel 38 is at least partially defined as the tubular element passing through the rotary actuator 37 and the bushing 33, so as to present an inlet end 38a placed at the top of the rotary actuator 37, and an outlet end 38b facing toward the presser roller 34, from the opposite side with respect to the laying plane 13. The continuous elongated element 31 coming from said supply reel is guided inside the longitudinal channel 38 entering from the inlet end 38a and leaving it from the outlet end 38b. In the vicinity of the outlet end 38b, the elongated element 31 is radially deflected towards at least one return element 39 fixed to the bushing 33 in a position spaced laterally from the presser roller 34.

The applicator 16 is preferably associated to auxiliary treatment devices 41, 42 that can be selectively activated as a result of the movement of the applicator 16 with respect to the rest condition. Such auxiliary treatment devices 41, 42 are preferably installed on a rocker arm element 40 oscillatably bound to the cursor 35, a short distance from the presser roller 34 and according to a pivoting axis P parallel to the rotation axis K of the presser roller itself.

Preferably, the auxiliary treatment devices comprise at least one cutting member 41, for example defined by a replaceable blade removably secured to the rocker arm element 40 and having at one end a cutting edge 41a facing the laying plane 13. The cutting member 41 is movable towards the laying plane 13 after being triggered by the rocker arm element 40, in order to sever the elongated element 31 in correspondence of the applicator 16.

In addition to or as an alternative to the cutting member 41, the auxiliary treatment devices may also comprise a braking element 42 operating in a thrust relationship on the applicator 16 in a rest condition, to lock against the same applicator the terminal portion 31a of said elongated element 31. A through channel 43 can be arranged through the braking element 42 to guide the terminal portion 31a of the elongated element 31, coming from the return element 39, to the presser roller 34. Preferably, the through channel 43 extends in a direction substantially tangential with respect to the outer cylindrical surface of the presser roller 34, in a median plane with respect to the roller itself.

The applicator 16 is also preferably associated to auxiliary return devices 44 operating on the rocker arm element 40 in order to elastically retain the latter in a first operating condition in which the braking element 42 operates in a thrust relationship on the applicator roller 16, while the cutting member 41 remains inactive close to the laminar support 5. The auxiliary return devices comprise, in the illustrated example, an elastic element 44 operatively stretched between two engagement seats respectively secured to the rocker arm element 40 and the bushing 33.

The rocker arm element 40 supports an abutment element that interferes against the bushing 33, so that the movement of the cursor 35 with respect to the support bracket 32, starting from the first operating condition, causes an angular rotation of the rocker arm element 40 around to its pivoting axis P, opposed by the tensioning of the elastic element 44. In the shown embodiment, said abutment is defined by a top end 41b of the cutting member 41, facing the cutting edge 41a and acting against the end plate 36 integral with the bushing 33.

In accordance with a method of application according to the present invention, what is now described is the functioning of one of the application apparatuses 30 for antennas, installed in each one of the first and second application stations 10a, 10b for antennas.

During the movement of the laminar support 5, the application apparatus 29 for antennas is in stand-by mode, wherein the applicator 16 is slightly raised from the laminar support 5, so as not to hinder its sliding on the laying plane 13 (FIG. 4).

The helicoidal spring M maintains the applicator 16 in the rest condition, with its own cursor 35 in a thrust relationship against the abutment seat 36a supported by the bushing 33.

The rocker arm element 40, kept in the respective first operating condition by the elastic element 44, keeps the braking element 42 that thrusts towards the presser roller 34. The terminal portion 31a of the elongated element 31, previously arranged along the respective supply path, is therefore blocked against the applicator 16 due to the action exerted by the braking element 42. A small part of the terminal portion 31a that is so retained protrudes tangentially with respect to the presser roller 34, in the lower part of the same.

If necessary, after being triggered by the movement device 12, the applicator 16 is positioned in vertical alignment with a respective terminal 24 of the previously applied RFID module on the laminar support 5. By lowering the operating head 15 along the vertical movement axis Z, the support bracket 32 is approached to the laying plane 13 and the terminal portion 31a of the elongated element 31, held in correspondence with the presser roller 34, is consequently brought against the laminar support 5, in correspondence of the respective terminal 24 of the RFID module.

Figure 5:
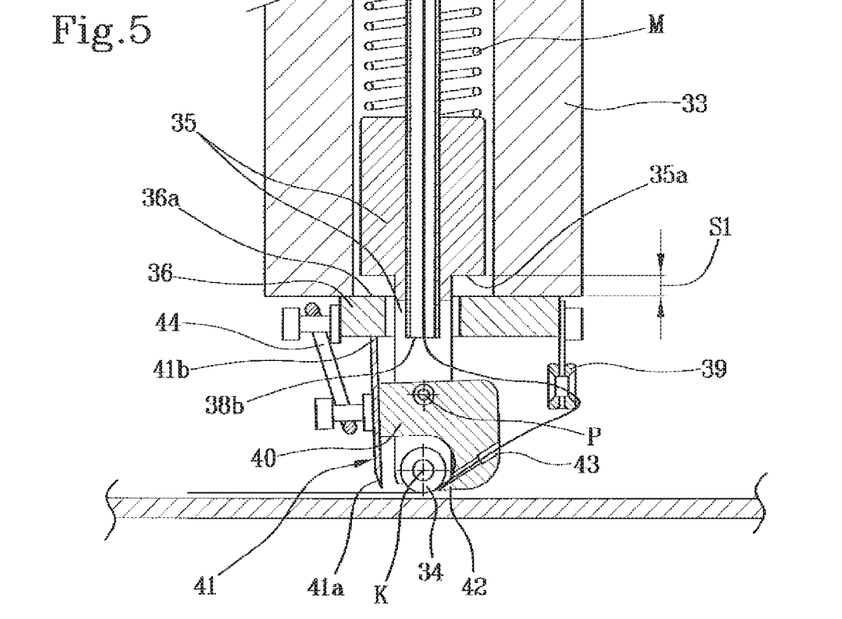
FIGS. 5 and 6 show an enlarged detail of the apparatus of FIG. 4, in different operative phases envisaged in the application process.

After the terminal portion 31a of the elongated element 31 has reached the laminar support 5, the lowering of the operating head 15 along the vertical movement axis Z keeps going for a short distance, so that the support bracket 32 comes even closer to the laying plane 13 until it reaches a release position (FIG. 5). The lowering of the applicator 16 being opposed by the laying plane 13 determines a slight lifting S1 of the applicator 16 with respect to the support bracket 32, starting from its rest condition. More particularly, the cursor 35 is separated from the abutment seat 36a by sliding towards the support bracket 32 and the applicator 16 reaches its first working condition in which, by effect of the helicoidal spring M, it operates in a thrust relationship towards the laying plane 13 of the laminar support 5.

Simultaneously, the cursor 35 slides towards the first working condition and causes the top end 41a of the cutting member 41 to act against the end plate 36, causing the selective activation/deactivation of the auxiliary treatment devices 41, 42, by means of an angular rotation of the rocker arm element 40 around the pivoting axis P. More specifically, on reaching the first operating condition of the cursor 35, the rocker arm element 40 enters into a second operating condition in which the braking element 42 is slightly spaced apart from the presser roller 34. At the same time, the cutting member 41 remains substantially inactive with its cutting edge 41a slightly spaced from the terminal portion 31a and the laminar support 5. The action of the braking element 42 on the terminal portion 31a of the elongated element 31 is thus interrupted, after the same terminal portion 31a has come into contact with the laminar support 5 in a thrust relationship.

Under the control of a programmable electronic unit (not shown) that oversees the functioning of the entire processing line or part thereof, the movement device 12 performs a relative movement between the applicator 16 and the support plane 13 along said transverse movement axis X and longitudinal movement axis Y, so that the continuous elongated element 31, which is subjected to the action of the elastic thrust by the applicator 16, is applied on the laminar support 5 according to the desired deposition path.

During the deposition procedure the rotary actuator 37, controlled by said electronic control unit, operates on the bushing 33 by orienting the applicator 16 around the oscillation axis R, according to rotations controlled in conjunction with the movement along the longitudinal Y and transversal X movement axes, so that the rotation axis K of the presser roller 34 maintains a perpendicular orientation with respect to the deposition path. In other words, the circumferential development of the outer cylindrical surface of the presser roller 34 maintains a parallel and tangential orientation with respect to the elongated element 31 in the point of contact with the same, while laying both linear and curved stretches of material along the deposition path. It is thus possible to prevent the generation of any deviation which might hinder the correct deposition of the elongated element 31, or its disengagement from the presser roller 34.

Upon completion of the deposition, a new translational movement of the operating head 15 along the vertical movement axis Z causes a further lowering of the support bracket 32 towards the laying plane 13, to reach a cutting position (FIG. 6) spaced in respect to the laminar support 5 according to a lower measurement if compared to what can be observed for the unlocked position.

Figure 6:
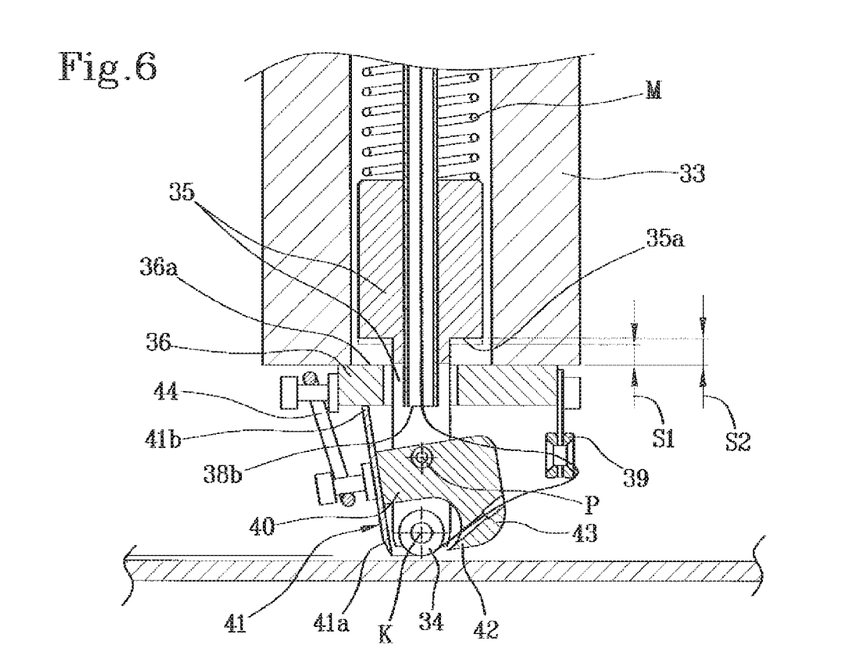

A further lifting S2 of the applicator 16 is thus determined with respect to the support bracket 32, which causes the cutting edge 41a of the cutting member 41 to be pushed against the laminar support 5, in order to sever the continuous elongated element 31 by causing the antenna 30 to be detached from the new terminal portion 31a.

Figure 7:
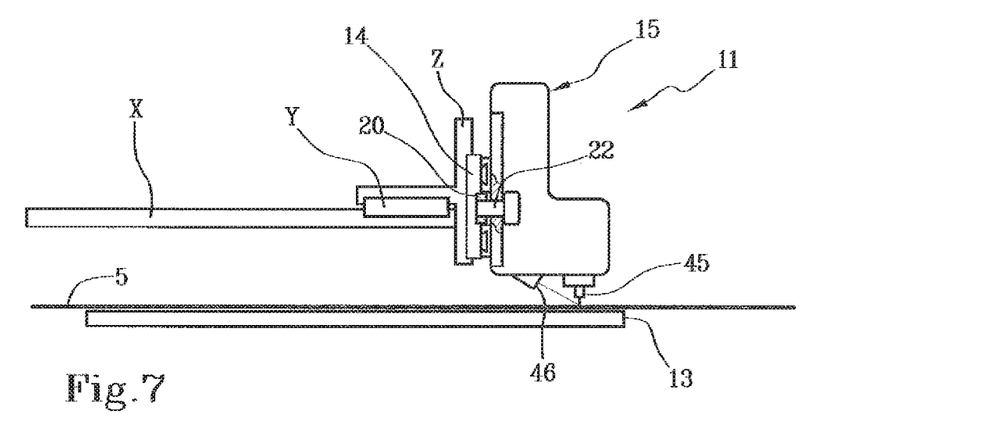
FIG. 7 is a schematic representation illustrating a module application station in side view.
Figure 8:
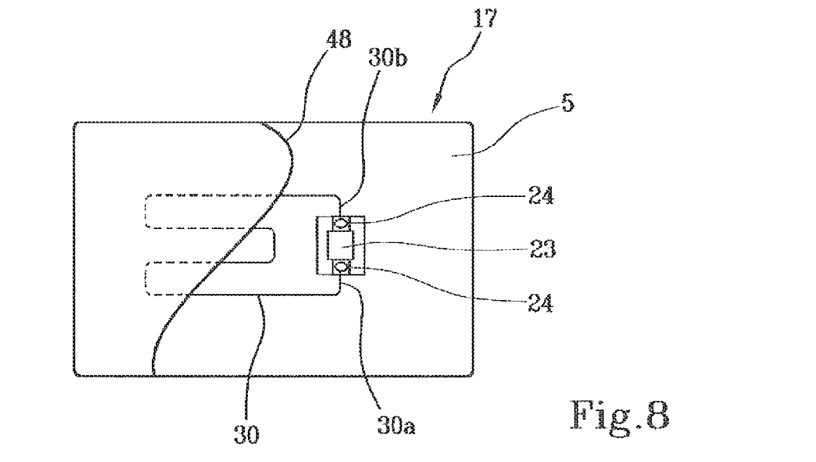
FIG. 8 schematically shows a RFID device obtainable in accordance with the present invention.

Each of the operating heads 15 equipping the movement device 12 installed in the fixing station 11, arranged downstream of the antenna application station(s) 10a, 10b, is configured to stably fix each antenna 30 to the respective RFID module 23, for example by making welds at the terminals 24 of the RFID module itself. To this end, as shown in FIG. 7, each operating head 15 can for example comprise a dispenser 45 laying filler material, and heating members, for example, a laser emitter 46, for applying and melting a predetermined quantity of filler material in correspondence of each terminal 24a of the RFID module 23, where ends 30a of the antenna 30 have been previously positioned.

It is also possible to provide at least one covering unit 47 located downstream of the fixing station 11 and configured to apply at least a covering layer 48 on the laminar support 5. Similarly to the laminar support 5, the covering layer 48 can be also realized in the form of a continuous sheet in paper or plastic material, and is for example coupled to the laminar support itself by means of a respective applicator in the form of a roller.

The work stations 2 can be interposed with auxiliary stations 49, 50 configured for performing additional processing operations on the RFID modules 24 being processed. For example, downstream of the covering unit 47, a testing station 49 may be provided, upon the action of which the operation of RFID devices 17 obtained is tested, as well as a possible printing station 50 for printing graphic patterns on the same RFID devices 17. The printing station 50, if located downstream of the testing station 49, can also be used to mark the RFID devices 17 that have not passed the tests performed in the testing station itself.

Downstream of the covering unit 47, at least one die-cutting station 51 can be also provided, which is configured for making mutually coupled separation and/or pre-breaking notches 52 in the laminar support 5 and the covering layer 48, so as to facilitate the mutual separation of the RFID devices 17 at a later time.

In the shown example, the drag assembly 6 is located downstream the processing line 1. It can be also envisaged that one or more workstations 2 and/or auxiliary workstations, for example the testing station 49 and/or the printing station 50 and/or the die-cutting station 51, are placed upstream of the drag assembly 6. A collection unit 53 positioned downstream of the processing line 1 receives the RFID devices 17, e.g. by wrapping them by means of one or more tapes rolled around the respective collection reels 54 after performing the longitudinal cutting, if needed.

On the continuous laminar support 5, reference indexes may be provided and they may be mutually spaced apart according at a substantially constant distribution pitch, preferably equal to the movement pitch of the laminar support with reference to the processing line 1. At each movement step at least one of the reference indexes 55 is therefore stopped at each of the work stations 2.

In a preferred embodiment example, shown in the accompanying figures, the reference indexes 55 are realized by means of a marking station 56 operatively interposed between the feed unit 3 and the module application station 9, preferably upstream of the winding unit 8. The marking station 56 can for example comprise at least one punch 56a movable alternately through the laminar support 5 to realize the reference indexes 55 in the form of shaped openings, for example square in shape, distributed along at least one of its longitudinal edges.

Alternatively, the marking station 56 can for example be configured to realize the reference indexes 55 in the form of graphic patterns printed on the laminar support 5.

In conjunction with each of said stop phases, the position of each applicator 16 can be advantageously adjusted with respect to at least one of the reference indexes 55 supported by the laminar support 5.

To this end, detection devices can be used comprising, for example, at least a digital camera 57 directed towards the support surface 13, or other suitable reading device (for example an electromechanical-type device) operatively associated to one or more of the work stations 2 to detect the position of reference index 55 on the laminar support 5, when the latter is stopped at the respective work station 2.

Each camera 57 can be for example fixed to one end of the support arm 14 carried by the respective movement device 12. The position of the reference index 55 detected inside the reading area can be used as a reference for positioning and/or moving the applicators 16 for the proper positioning of the RFID component.

To this end, following the execution of each movement step of the drag assembly 6, portions of the laminar support 5, each carrying at least one of said reference marks 55, are stopped in correspondence of each one of the work stations 2.

Each of the cameras 57 attached to the application stations 9, 10a, 10b, 11 detects the position of the reference index 55 on the laminar support portion 5 during the stop phase on the respective laying plane 13, and sends to said electronic control unit any piece of information related to that position.

On the basis of the information received from the camera 57, the electronic control unit controls the movement device 12 installed in each application station 9, 10a, 10b, 11, by translating the respective operating heads 15 parallel to the longitudinal movement axis Y and/or transverse movement axis X, according to a geometrical plane parallel to the laying plane 13 of the laminar support 5. Each applicator 16 is thus provided with a predetermined position in relation to the reference index 55 carried by the respective portion of the laminar support 5. In particular, in the antennas application stations 10a, 10b each of the applicators 16 can, for example, be positioned exactly on top of one of the terminals 24 of the respective RFID module 23.

Therefore, at each application station, the operation of the operating heads 15 and of the applicators 16 can be controlled so as to determine, by lowering the applicator 16 along the vertical movement axis Z, the application of the components of the RFID device 17 (RFID modules 23, antennas 30, welds) at respective predetermined points in relation to each of the respective reference indexes 55.

The invention claimed is:

1. A method for applying antennas for RFID devices on a laminar support comprising:
    preparing a laminar support on a laying plane;
    driving a continuous elongated element of conductive material along a feeding path leading to an applicator projecting downwards from a support bracket, for positioning a terminal portion of the elongated element in an application position between the applicator and the laminar support;
    approaching the support bracket to the laying plane according to a vertical movement axis to bring the terminal portion of the elongated element against the laminar support;
    achieving a relative movement between the applicator and the laying plane along movement axes respectively perpendicular and parallel to the laying plane, for depositing the elongated element on the laminar support according to a predetermined deposition path;
    wherein, during deposition, the applicator operates on the elongated element in an elastic thrust relationship towards the laminar support.

2. The method according to claim 1, in which auxiliary treatment devices operating on the elongated element in proximity of the applicator are selectively activated/deactivated as a result of a vertical movement of a cursor with respect to the support bracket.

3. The method according to claim 1 wherein, before coming into contact against the laminar support, the terminal portion of said elongated element is blocked against the applicator by a braking element operating in a thrust relationship towards the applicator.

4. The method according to claim 3, wherein an action of the braking element is interrupted after the terminal portion of the elongated element has come into contact against the laminar support, before achieving said relative movement.

5. The method according to claim 1 wherein, at an end of the deposition, said elongated element is severed by a cutting member operable by a vertical movement of the applicator with respect to the support bracket.

6. The method according to claim 1 wherein, during deposition, the applicator is oriented around an oscillation axis perpendicular to the laminar support, according to controlled rotations in conjunction with the movement along said longitudinal movement axis and transverse movement axis.

7. An apparatus for applying antennas for RFID devices on a laminar support, comprising:
   at least one support bracket;
   an applicator operatively carried by said at least one support bracket and projecting downward therefrom, toward a laying plane of a laminar support;
   guiding members operating along a continuous elongated element made of conductive material, for positioning a terminal portion of said elongated element in an application position between the applicator and said laying plane;
   devices for relative movement between the applicator and the laying plane of the laminar support, according to respectively orthogonal movement axes including a vertical movement axis perpendicular to said laying plane;
   wherein the applicator is slidably guided relative to the at least one support bracket along a direction parallel to said vertical movement axis and movable toward the at least one support bracket in opposition to elastic contrast devices.

8. The apparatus according to claim 7, further comprising auxiliary treatment devices operating on said elongated element in proximity of the applicator and selectively activated as a result of movements of the applicator relative to the at least one support bracket.

9. The apparatus according to claim 8, wherein said auxiliary treatment devices are carried by a rocker arm element oscillatably hinged to the applicator, and movable in consequence of movement of the applicator with respect to the at least one support bracket.

10. The apparatus according to claim 8, wherein said auxiliary treatment devices comprise a braking element acting in a thrust relationship on the applicator, to lock against the applicator the terminal portion of said elongated element.

11. The apparatus according to claim 10, wherein said applicator comprises a presser roller rotatable about a respective rotation axis parallel to the laying plane and wherein the braking element has a through channel extending in a direction substantially tangential with respect to an outer cylindrical surface of the presser roller, in a median plane with respect to the pressure roller.

12. The apparatus according to claim 8, wherein said auxiliary treatment devices comprise a cutting member movable towards the laying plane for severing the elongated element in correspondence of the applicator.

13. The apparatus according to claim 7, wherein said applicator comprises a bushing rotatably carried by said at least one support bracket and a rotary actuator operating between the at least one support bracket and said bushing to orient the applicator about a vertical oscillation axis.

* * * * *